US009524874B2

(12) United States Patent
Venkataraman et al.

(10) Patent No.: US 9,524,874 B2
(45) Date of Patent: Dec. 20, 2016

(54) AQUEOUS POLISHING COMPOSITION AND PROCESS FOR CHEMICALLY MECHANICALLY POLISHING SUBSTRATES CONTAINING SILICON OXIDE DIELECTRIC AND POLYSILICON FILMS

(75) Inventors: Shyam Sundar Venkataraman, Zhongli (TW); Eason Yu-Shen Su, New Taipei (TW); Arend Jouke Kingma, Ludwigshafen (DE); Bastian Marten Noller, Lorsch (DE)

(73) Assignee: BASF SE, Ludwigshafen (DE)

( * ) Notice: Subject to any disclaimer, the term of this patent is extended or adjusted under 35 U.S.C. 154(b) by 320 days.

(21) Appl. No.: 13/991,924

(22) PCT Filed: Dec. 7, 2011

(86) PCT No.: PCT/IB2011/055506
§ 371 (c)(1),
(2), (4) Date: Jun. 6, 2013

(87) PCT Pub. No.: WO2012/077063
PCT Pub. Date: Jun. 14, 2012

(65) Prior Publication Data
US 2013/0248756 A1    Sep. 26, 2013

Related U.S. Application Data

(60) Provisional application No. 61/421,640, filed on Dec. 10, 2010.

(30) Foreign Application Priority Data

Dec. 10, 2010 (EP) .................................. 10194476

(51) Int. Cl.
C09K 13/06      (2006.01)
H01L 21/306     (2006.01)
C09G 1/02       (2006.01)
C09K 3/14       (2006.01)
H01L 21/3105    (2006.01)

(52) U.S. Cl.
CPC ........... H01L 21/30625 (2013.01); C09G 1/02 (2013.01); C09K 3/1409 (2013.01); C09K 3/1463 (2013.01); H01L 21/31053 (2013.01)

(58) Field of Classification Search
None
See application file for complete search history.

(56) References Cited

U.S. PATENT DOCUMENTS

| 578,882 | A | 3/1897 | Kennedy |
|---|---|---|---|
| 5,057,560 | A | 10/1991 | Mueller |
| 5,587,143 | A * | 12/1996 | Wong ............................ 424/9.1 |
| 5,738,800 | A | 4/1998 | Hosali et al. |
| 5,759,917 | A | 6/1998 | Grover et al. |
| 6,042,741 | A | 3/2000 | Hosali et al. |
| 6,068,787 | A | 5/2000 | Grumbine et al. |
| 6,083,838 | A | 7/2000 | Burton et al. |
| 6,110,396 | A | 8/2000 | Ronay |
| 6,132,637 | A | 10/2000 | Hosali et al. |
| 6,218,305 | B1 | 4/2001 | Hosali et al. |
| 6,238,469 | B1 | 5/2001 | Ronay |
| 6,299,659 | B1 | 10/2001 | Kido et al. |
| 6,436,835 | B1 | 8/2002 | Kido et al. |
| 6,491,843 | B1 | 12/2002 | Srinivasan et al. |
| 6,544,892 | B2 | 4/2003 | Srinivasan et al. |
| 6,616,514 | B1 | 9/2003 | Edelbach et al. |
| 6,626,968 | B2 | 9/2003 | Park et al. |
| 6,627,107 | B2 | 9/2003 | Srinivasan et al. |

(Continued)

FOREIGN PATENT DOCUMENTS

| DE | 26 10 705 | 9/1977 |
|---|---|---|
| EP | 0 583 814 | 2/1994 |

(Continued)

OTHER PUBLICATIONS

Wikipedia, hydrophilic-lipophilic balance, Aug. 7, 2006, Wikipedia, first page and date stamp.*
Kang et al, Influences of pH and Concentration of Surfactant on the Electrokinetic Behavior of a Nano-Ceria Slurry in Shallow Trench Isolation Chemical Mechanical Polishing), Oct. 2005, Journal of the Korean Physical Society, vol. 47, No. 4, Abstract.*
Gedde, Polymer Physics, 2001, Springer Science, Cover, ISBN page, p. 1.*
Van Vlack, Materials for Engineering, Addison-Wesley Publishing, ISBN page, Polymers portion of p. 12.*
U.S. Appl. No. 13/820,765, filed Apr. 25, 2013, Li, et al.
BASF Corporation, Brochure "Pluronic & Tetronic", Total pp. 41, (1999).

(Continued)

Primary Examiner — Nadine Norton
Assistant Examiner — David Cathey, Jr.
(74) Attorney, Agent, or Firm — Oblon, McClelland, Maier & Neustadt, L.L.P.

(57) ABSTRACT

An aqueous polishing composition comprising (A) abrasive ceria particles and (B) amphiphilic nonionic surfactants selected water-soluble and water-dispersible, linear and branched polyoxyalkylene blockcopolymers of the general formula I: $R[(B1)_m/(B2)_nY]_p$ (I), wherein the indices and the variables have the following meaning: m, n, and p integers $\geq 1$; R hydrogen atom or monovalent or polyvalent organic residue, except $C_5\text{-}C_{20}$ alkyl groups; (B1) block of oxyethylene monomer units; (B2) block of substituted oxyalkylene monomer units wherein the substituents are selected from two methyl groups, alkyl groups of more than two carbon atoms and cycloalkyl, aryl, alkyl-cycloalkyl, alkyl-aryl, cycloalkyl-aryl and alkyl-cycloalkyl-aryl groups; and Y hydrogen atom or monovalent organic residue, except $C_5\text{-}C_{20}$ alkyl groups; with the proviso that when (B) contains more than one block (B1) or (B2) two blocks of the same type are separated by a block of the other type.

17 Claims, No Drawings

(56) References Cited

U.S. PATENT DOCUMENTS

| | | | |
|---|---|---|---|
| 6,645,051 | B2 | 11/2003 | Sugiyama et al. |
| 6,645,265 | B1 | 11/2003 | Wang |
| 6,682,642 | B2 | 1/2004 | Mikkola et al. |
| 6,689,692 | B1 | 2/2004 | Grover et al. |
| 6,984,588 | B2 | 1/2006 | Grover et al. |
| 7,071,105 | B2 | 7/2006 | Carter et al. |
| 7,250,391 | B2 | 7/2007 | Kanno et al. |
| 7,300,601 | B2 | 11/2007 | Liu et al. |
| 7,314,578 | B2 | 1/2008 | Choi et al. |
| 7,361,603 | B2 | 4/2008 | Liu et al. |
| 7,364,600 | B2 * | 4/2008 | Kim et al. ............ 51/307 |
| 2002/0198328 | A1 | 12/2002 | L'Alloret |
| 2003/0228762 | A1 | 12/2003 | Moeggenborg et al. |
| 2004/0209095 | A1 | 10/2004 | Manias et al. |
| 2004/0217009 | A1 | 11/2004 | Mikkola et al. |
| 2005/0014667 | A1 | 1/2005 | Aoyama et al. |
| 2005/0130428 | A1 | 6/2005 | Choi et al. |
| 2005/0176259 | A1 | 8/2005 | Yokoi et al. |
| 2005/0266683 | A1 | 12/2005 | Lee |
| 2006/0124594 | A1 | 6/2006 | Lim et al. |
| 2006/0141254 | A1 | 6/2006 | Kramer et al. |
| 2006/0144824 | A1 | 7/2006 | Carter et al. |
| 2006/0207188 | A1 | 9/2006 | Paik et al. |
| 2006/0213780 | A1 | 9/2006 | Shih et al. |
| 2006/0216935 | A1 | 9/2006 | Oswald et al. |
| 2007/0029198 | A1 | 2/2007 | Kooi |
| 2007/0077865 | A1 | 4/2007 | Dysard et al. |
| 2007/0175104 | A1 | 8/2007 | Nishiyama et al. |
| 2007/0191244 | A1 | 8/2007 | Cho et al. |
| 2007/0218811 | A1 | 9/2007 | Kurata et al. |
| 2007/0289875 | A1 | 12/2007 | Paneccasio, Jr. et al. |
| 2008/0050435 | A1 | 2/2008 | Hennink et al. |
| 2008/0085602 | A1 | 4/2008 | Seong et al. |
| 2008/0124913 | A1 | 5/2008 | Choi et al. |
| 2008/0249210 | A1 | 10/2008 | Entenmann et al. |
| 2008/0254628 | A1 | 10/2008 | Boggs et al. |
| 2008/0280452 | A1 | 11/2008 | Yokoi et al. |
| 2008/0281486 | A1 | 11/2008 | Sakuma |
| 2009/0013609 | A1 | 1/2009 | Gupta et al. |
| 2012/0208344 | A1 | 8/2012 | Lauter et al. |
| 2013/0161285 | A1 | 6/2013 | Li et al. |
| 2013/0168348 | A1 | 7/2013 | Li et al. |
| 2013/0171824 | A1 | 7/2013 | Li et al. |

FOREIGN PATENT DOCUMENTS

| | | |
|---|---|---|
| EP | 1 036 836 | 9/2000 |
| EP | 1 197 587 | 4/2002 |
| EP | 1 306 415 | 5/2003 |
| EP | 1 534 795 | 7/2006 |
| EP | 1 942 179 | 7/2008 |
| JP | 2001 240850 | 9/2001 |
| JP | 2005 336400 | 12/2005 |
| WO | 01 60926 | 8/2001 |
| WO | 2004 029160 | 4/2004 |
| WO | 2004 052946 | 6/2004 |
| WO | 2004 063301 | 7/2004 |
| WO | 2005 014753 | 2/2005 |
| WO | 2005 035688 | 4/2005 |
| WO | 2006 093242 | 9/2006 |
| WO | 2007 012763 | 2/2007 |
| WO | 2010 123300 | 10/2010 |
| WO | 2012 046179 | 4/2012 |

OTHER PUBLICATIONS

Choi, K.S., et al., "Engineered porous and coated Silica particulates for CMP applications", Mat. Res. Soc. Symp. Proc. vol. 671, Materials Research Society, pp. M5.8.1 to M5.8.10, (2001).

Lee, Seung-Ho et al., "Chemical mechanical polishing of thermal oxide films using silica particles coated with ceria", J. Mater. Res., Materials Research Society, vol. 17, No. 10, pp. 2744 to 2749, (2002).

Jindal, A. et al., "Chemical Mechanical Polishing of Dielectric Films Using Mixed Abrasive Slurries", Journal of The Electrochemical Society, vol. 150, No. 5, pp. G314 to G318, (2003).

Lu, Z., et al., "Effects of mixed abrasives in chemical mechanical polishing of oxide films", J. Mater. Res., Materials Research Society, vol. 18, No. 10, pp. 2323 to 2330, (Oct. 2003).

Hegde, S. et al., "Study of Surface Charge Effects on Oxide and Nitride Planarization Using Alumina/Ceria Mixed Abrasive Slurries", Electrochemical and Solid-State Letters, vol. 7, No. 12, pp. G316 to G318, (2004).

Prasad, Y. N. et al., "Role of Amino-Acid Adsorption on Silica and Silicon Nitride Surfaces during STI CMP", Electrochemical and Solid-State Letters, vol. 9, No. 12, pp. G337 to G339, (2006).

Kang, Hyun-Goo, et al., "Effects of abrasive particle size and molecular weight of poly (acrylic acid) in ceria slurry on removal selectivity of $SiO_2/Si_3N_4$ films in shallow trench isolation chemical mechanical planarization", Journal of Material Research, Materials Research Society, vol. 22, No. 3, pp. 777 to 787, (Mar. 2007).

Kim, S. et al., "Adsorption behavior of anionic polyelectrolyte for chemical mechanical polishing (CMP)", Journal of Colloid and Interface Science, vol. 319, pp. 48 to 52, (2008).

America, W., et al., "Slurry Additive Effects on the Suppression of Silicon Nitride Removal during CMP", Electrochemical and Solid-State Letters, vol. 7, No. 12, pp. G327 to G330, (2004).

Mori, H. et al., "Controlled synthesis of thermoresponsive polymers derived from L-proline via RAFT polymerization", Chem. Commun., The Royal Society of Chemistry, pp. 4872 to 4874, (2005).

Schmaljohann, D., "Thermo- and pH-responsive polymers in drug delivery", Advanced Drug Delivery Reviews, vol. 58, pp. 1655 to 1670, (2006).

European Search Report issued May 12, 2011 in Patent Application No. 10 19 4476.

International Search Report issued May 3, 2012 in PCT/IB11/55506.

U.S. Appl. No. 14/362,510, filed Jun. 3, 2014, Raman, et al.

* cited by examiner

AQUEOUS POLISHING COMPOSITION AND PROCESS FOR CHEMICALLY MECHANICALLY POLISHING SUBSTRATES CONTAINING SILICON OXIDE DIELECTRIC AND POLYSILICON FILMS

CROSS REFERENCE TO RELATED APPLICATIONS

The present application is a 35 U.S.C. §371 national stage patent application of international patent application PCT/IB2011/055506, filed on Dec. 7, 2011, published as WO 2012077063 on Jun. 1, 2012, the text of which is incorporated by reference, and claims the benefit of the filing dates of U.S. Provisional Application No. 61/421,640, filed on Dec. 10, 2010, the text of which is also incorporated by reference, and European Application No. 10194476.7, filed on Dec. 10, 2010, the text of which is also incorporated by reference.

The present invention is directed to a novel aqueous polishing composition which is particularly suitable for polishing semiconductor substrates containing silicon oxide dielectric and polysilicon films, optionally containing silicon nitride films.

Moreover, the present invention is directed to a novel process for polishing substrates for manufacturing electrical, mechanical and optical devices, the said substrate materials containing silicon oxide and polysilicon films, optionally containing silicon nitride films.

CITED DOCUMENTS

The documents cited in the present application are incorporated by reference in their entirety.

BACKGROUND OF THE INVENTION

Chemical mechanical planarization or polishing (CMP) is the primary process to achieve local and global planarity of integrated circuits (ICs) devices. The technique typically applies CMP compositions or slurries containing abrasives and other additives as an active chemistry between a rotating substrate surface and a polishing pad under an applied load. Thus, the CMP process couples a physical process such as abrasion with a chemical process such as oxidation or chelation. It is not desirable for the removal or polishing of substrate materials to be comprised of purely physical or purely chemical action, but rather the synergistic combination of both in order to achieve a fast uniform removal.

This way, the substrate material is removed until the desired planarity is achieved or a barrier sublayer or stopping film is exposed. Ultimately, a planar, defect-free surface is obtained which enables proper multilayer IC device fabrication by subsequent photolithography, patterning, etching and thin-film processing.

Shallow trench isolation (STI) is a specific CMP application which generally requires the selective removal of silicon dioxide to silicon nitride on a patterned wafer substrate. In this case, etched trenches are overfilled with a dielectric material, e.g., silicon dioxide, which is polished using the silicon nitride barrier film as the stopping film. The CMP process ends with clearing the silicon dioxide from the barrier film while minimizing the removal of exposed silicon nitride and trench silicon dioxide.

This requires CMP slurries capable of achieving a high relative ratio of silicon dioxide material removal rate MRR to silicon nitride removal rate MRR which ratio is also referred to in the art as oxide-to-nitride selectivity.

Recently, polysilicon films are also used as barrier films or as an electrode material (cf. the American patent U.S. Pat. No. 6,626,968 B2). Therefore, it has become highly desirable to have CMP slurries and methods available which allow for the global planarization of substrates containing silicon oxide dielectric and polysilicon films. This requires CMP slurries exhibiting a high oxide-to-polysilicon selectivity.

It is even more desirable to have CMP slurries and methods available which allow for the global planarization of substrates additionally containing silicon nitride films.

In this case, the oxide-to-nitride selectivity should not be too high, in order to avoid dishing, and other damages and defects in the globally planarized, heterogeneous, patterned surface containing silicon dioxide, silicon nitride and polysilicon areas. However, the silicon nitride-to-polysilicon selectivity should also be high.

Ceria-based CMP slurries have received considerable attention in STI applications because of their ability to achieve a comparatively high oxide-to-nitride selectivity due to the high chemical affinity of ceria to silicon dioxide which is also referred to in the art as the chemical tooth action of ceria.

Nevertheless, the oxide-to-polysilicon selectivity of ceria-based CMP slurries must be improved by additives which "tailor" the selectivity.

Numerous attempts have been made to tailor the selectivity of ceria-based CMP slurries.

Thus, Jae-Don Lee et al. disclose in Journal of the Electrochemical Society, 149 (8), G477-G481, 2002, the effects of nonionic surfactants with different hydrophile-lipophile-balance (HLB) values such as polyethyleneoxides, ethyleneoxide-propyleneoxide copolymers and ethyleneoxide-propyleneoxide-ethyleneoxide triblock copolymers on oxide-to-polysilicon selectivity during CMP. However, fumed silica is used as the abrasive and the oxide-to-nitride selectivity is not addressed.

The American patent application US 2002/0034875 A1 and the American patent U.S. Pat. No. 6,626,968 B2 disclose a ceria-based CMP slurry containing surfactants, pH adjusting agents such as potassium hydroxide, sulfuric acid, nitric acid, hydrochloric acid or phosphoric acid, and polymers containing a hydrophilic functional group and a lipophilic functional group such as polyvinyl methyl ether (PVME), polyethylene glycol (PEG), polyoxyethylene 23 lauryl ether (POLE), polypropanoic acid (PPA), polyacrylic acid (PM), and polyether glycol bis ether (PEGBE). The ceria-based CMP slurry increases the oxide-to-polysilicon selectivity.

The American patent U.S. Pat. No. 6,645,051 B2 discloses a ceria-based CMP slurry for polishing memory hard disk substrates containing at least one nonionic surfactant selected from the group consisting of polyoxyethylene polyoxypropylene alkyl ethers and polyoxyethylene polyoxypropylene copolymers.

The US patent application US 2003/0228762 A1 discloses a CMP slurry for polishing substrates containing a low-k dielectric film, the said CMP slurry containing abrasive particles selected from the group consisting of alumina, silica, titania, ceria, zirconia, germania, magnesia, and co-formed products thereof; and amphiphilic nonionic surfactants having at least one lipophilic head group and at least one hydrophilic tail group.

According to the US 2003/0228762 A1, suitable head groups include polysiloxanes, tetra-$C_{1-4}$-alkyldecynes, saturated or partially unsaturated $C_{6-30}$ alkyl groups, polyoxypropylene groups, $C_{6-12}$ alkyl phenyl or alkyl cyclohexyl groups, and polyethylene groups. Suitable tail groups include polyoxyethylene groups. Thus, the amphiphilic nonionic surfactant can be selected from the group consisting of polyoxyethylene alkyl ethers or esters.

The American patent application US 2006/0124594 A1 discloses a ceria-based CMP slurry having a viscosity of at least 1.5 cP and comprising a viscosity increasing agent including a nonionic polymer such as polyethylene glycol (PEG). The ceria-based CMP slurry is said to have a high oxide-to-nitride selectivity and to cause a low within-wafer non-uniformity WIWNU.

The American patent application US 2006/0216935 A1 discloses a ceria-based CMP slurry comprising protein, lysine and/or arginine and a pyrrolidone compounds such as polyvinylpyrrolidone (PVP), N-octyl-2-pyrrolidone, N-ethyl-2-pyrrolidone, N-hydroxyethyl-2-pyrrolidone, N-cyclohexyl-2-pyrrolidone, N-butyl-2-pyrrolidone, N-hexyl-2-pyrrolidone, N-decyl-2-pyrrolidone, N-octadecyl-2-pyrrolidone, and N-hexadecyl-2-pyrrolidone. The ceria-based CMP slurry can furthermore contain dispersing agents like polyacrylic acid, glycols and polyglycols. Specific examples use proline, polyvinylpyrrolidone or N-octyl-2-pyrrolidone, PPO/PEO blockcopolymers, and glutaraldehyde. The ceria-based CMP slurry is believed to not aggressively remove trench silicon dioxide thereby allowing for extended polishing beyond the endpoint without substantially increasing the minimum step height.

The American patent application US 2007/0077865 A1 discloses a ceria-based CMP slurry containing polyethyleneoxide/polypropyleneoxide copolymers preferably from the Pluronic™ family sold by BASF. The ceria-based CMP slurry can furthermore contain amino alcohols such as 2-dimethylamino-2-methyl-1-propanol (DMAMP), 2-amino-2-ethyl-1-propanol (AMP), 2-(2-aminoethylamino)ethanol, 2-(isopropylamino)ethanol, 2-(methylamino)ethanol, 2-(diethylamino)ethanol, 2-(2-dimethylamino)ethoxy)ethanol, 1,1'-[[3-(dimethylamino)propyl]imino]-bis-2-propanol, 2-(2-butylamino)ethanol, 2-(tert-butylamino)ethanol, 2-(diisopropylamino)ethanol, and N-(3-aminopropyl)morpholine. The ceria-based CMP slurry may furthermore contain quaternary ammonium compounds like tetramethylammonium hydroxide, film forming agents such as alkyl amines, alkanolamines, hydroxyl amines, phosphate esters, sodium lauryl sulfate, fatty acids, polyacrylates, polymethacrylates, polyvinylphosphonates, polymalates, polystyrene sulfonate, polyvinyl sulfate, benzotriazole, triazole, and benzoimidazole, and complexing agents such as acetylacetone, acetates, glycolates, lactates, gluconates, gallic acid, oxalates, phthalates, citrates, succinates, tartates, malates, ethylenediaminetetraacetic acid, ethylene glycol, pyrocatechol, pyrogallol, tannic acid, phosphonium salts and phosphonic acids. The ceria-based CMP slurry is believed to provide good selectivity of silicon dioxide and/or silicon nitride relative to polysilicon.

The American patent application US 2007/0175104 A1 discloses a ceria-based CMP slurry comprising a polysilicon polishing inhibitor which is selected from water-soluble polymers having a N-monosubstituted or N,N-di-substituted skeleton substituted by any members selected from the group consisting of acrylamide, methacrylamide and alpha-substituted derivatives thereof; polyethylene glycols; polyvinylpyrrolidones; alkoxylated linear aliphatic alcohols and ethyleneoxide adducts of acetylene-based diols. The ceria-based CMP slurry may contain additional water-soluble polymers such as polysaccharides like alginic acid, pectinic acid, carboxymethylcellulose, agar, curdlan, and pullulan; polycarboxylic acids such as polyaspartic acid, polyglutamic acid, polylysine, polymalic acid, polymethacrylic acid, polyimide acid, polymaleic acid, polyitaconic acid, polyfumaric acid, poly(p-styrene carboxylic acid), polyacrylic acid, polyacrylamide, amino polyacrylamide, polyglyoxalic acid and their salts; and vinyl polymers such as polyvinyl alcohol, and polyacrolein. The ceria-based CMP slurry is said to have a high silicon dioxide over polysilicon selectivity.

The American patent applications US 2008/0085602 A1 and US 2008/0124913 A1 disclose a ceria-based CMP slurry containing 0.001 to 0.1% by weight of the nonionic surfactant selected from ethyleneoxide-propyleneoxide-ethyleneoxide triblock copolymers and polyacrylic acid as dispersing agent. The ceria-based slurry he said to have a high silicon dioxide and silicon nitride over polysilicon selectivity.

The American patent application US 2008/0281486 discloses a ceria-based CMP slurry containing nonionic surfactants having a hydrophilic-lipophilic balance (HLB) value in the range of from 12 to 17. The nonionic surfactants are selected from the group consisting of polyoxyethylene lauryl ether, polyoxyethylene cetyl ether, polyoxyethylene oleyl ether, polyoxyethylene sorbitan monolaurate, polyoxyethylene isooctyl phenyl ether and mixtures thereof. In the CMP slurry is said to have a high silicon dioxide over polysilicon selectivity.

The fabrication of electrical devices, in particular, semiconductor integrated circuits (ICs); requires high precision methods which involve inter alia high selectivity CMP.

Although the prior art ceria-based CMP slurries may have a satisfactory oxide-to-polysilicon selectivity and may yield polished wafers having a good global and local planarity as exemplified by the within-wafer nonuniformity (WIWNU) and the wafer-to-wafer nonuniformity (WTWNU), the ever decreasing dimensions of the IC architectures, in particular ICs with LSI (large-scale integration) or VLSI (very-large-scale integration), necessitate the constant improvement of the ceria-based CMP slurries in order to and meet the ever increasing technical and economical demands of the manufacturers of integrated circuit devices.

However, this pressing need to constantly improve the prior art ceria-based CMP slurries does not only apply to the field of integrated circuit devices, but the polishing and planarization efficacy has also to be improved in the fields of manufacturing other electrical devices such as liquid crystal panels, organic electroluminescent panels, printed circuit boards, micro machines, DNA chips, micro plants, photovoltaic cells, and magnetic heads; as well as high precision mechanical devices and optical devices, in particular, optical glasses such as photo-masks, lenses and prisms, inorganic electro-conductive films such as indium tin oxide (ITO), optical integrated circuits, optical switching elements, optical waveguides, optical monocrystals such as the end faces of optical fibers and scintillators, solid laser monocrystals, sapphire substrates for blue laser LEDs, semiconductor monocrystals, and glass substrates for magnetic disks. The manufacturing of such electrical, mechanical and optical devices also requires high precision CMP process steps.

The Japanese patent application JP 2001-240850 A discloses a CMP slurry containing a alumina, zirconia or silicon carbide as the abrasive, an alkylene oxide-ethyleneoxide block or random copolymer as dispersing agent and sodium phosphate or sodium polyphosphate as an "anti-rust".

The alkylene oxide-ethyleneoxide copolymer is of the general formula:

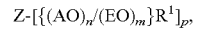

wherein the indices in the variables have the following meaning:
p integer from 1 to 6;
n integer with an average value of 10 to 200;
m integer with an average value of 1 to 300;
E ethylene group;
A propylene or 1,2-, 2,3-, 1,3- or 1,4-butylene group;
Z residue of a p-hydric alcohol; and
$R^1$ hydrogen atom, alkyl group having 1 to 18 carbon atoms or acyl group having 2 to 24 carbon atoms.

The CMP slurry is used for polishing silicon wafers, glass, aluminum, ceramic, synthetic silica, quartz and sapphire. Nothing is disclosed about silicon dioxide and/or silicon nitride over polysilicon selectivities.

The prior provisional American patent application U.S. Ser. No. 61/380,719 filed on Sep. 8, 2010 describes a ceria-based CMP slurry containing at least one water-soluble polymer selected from the group consisting of linear and branched alkylene oxide homopolymers and copolymers as disclosed in the Japanese patent application JP 2001-240850 A, the American patent applications US 2007/0077865 A1, US 2006/0124594 A1 and US 2008/0124913 A1, the American patent US 2006/0213780 A1 and the company brochure of BASF Corporation "Pluronic™ & Tetronic™ Block Copolymer Surfactants, 1996". Moreover, the ceria-based CMP slurry contains at least one anionic phosphate dispersing agent. The ceria-based CMP slurry exhibits an excellent oxide-to-polysilicon selectivity and a high nitride-to-polysilicon selectivity coupled with an advantageous oxide-to-nitride selectivity.

The prior European patent application No. 10186886.7 filed on Oct. 7, 2010 describes a silica-based CMP slurry containing at least one amphiphilic nonionic surfactant selected from the group consisting of water-soluble or water dispersible surfactants having at least one lipophilic group (b1) selected from the group consisting of branched alkyl groups having 5 to 20 carbon atoms; and at least one hydrophilic group (b2) selected from the group consisting of polyoxyalkylene groups comprising oxyethylene monomer units (b21) and at least one type of substituted oxyalkylene monomer units (b22) wherein the substituents are selected from the group consisting of alkyl, cycloalkyl, or aryl, alkyl-cycloalkyl, alkyl-aryl, cycloalkyl-aryl and alkyl-cycloalkyl-aryl groups; the said polyoxyalkylene group containing the monomer units (b21) and (b22) in random, alternating, gradient and/or blocklike distribution. The CMP slurry exhibits high silicon dioxide, tantalum nitride and copper over ultra-low-k dielectric material selectivities.

OBJECTS OF THE INVENTION

Therefore, it is an object of the present invention to provide a novel aqueous polishing composition, in particular a novel chemical mechanical polishing (CMP) composition, especially a novel ceria-based CMP slurry, which no longer exhibits the disadvantages and drawbacks of the prior art polishing compositions.

In particular, the novel aqueous polishing composition, in particular the novel chemical mechanical polishing (CMP) composition, especially the novel ceria-based CMP slurry, should exhibit a significantly improved oxide-to-polysilicon selectivity and yield polished wafers having an excellent global and local planarity as exemplified by the within-wafer nonuniformity (WIWNU) and the wafer-to-wafer nonuniformity (WTWNU). Therefore, they should be excellently suited for manufacturing IC architectures, in particular ICs with LSI (large-scale integration) or VLSI (very-large-scale integration), having structures with dimensions below 50 nm.

Most particularly, the novel ceria-based CMP slurries should also exhibit an advantageous nitride-to-polysilicon selectivity and an advantageous oxide-to-nitride selectivity.

Moreover, the novel aqueous polishing composition, in particular the novel chemical mechanical polishing (CMP) composition and especially the novel ceria-based CMP slurry should not only be exceptionally useful in the field of integrated circuit devices, but should also be most efficiently and advantageously useful in the fields of manufacturing other electrical devices such as liquid crystal panels, organic electroluminescent panels, printed circuit boards, micro machines, DNA chips, micro plants and magnetic heads; as well as high precision mechanical devices and optical devices, in particular, optical glasses such as photo-masks, lenses and prisms, inorganic electro-conductive films such as indium tin oxide (ITO), optical integrated circuits, optical switching elements, optical waveguides, optical monocrystals such as the end faces of optical fibers and scintillators, solid laser monocrystals, sapphire substrates for blue laser LEDs, semiconductor monocrystals, and glass substrates for magnetic disks.

It is a further object of the present invention to provide a novel process for polishing substrates for mechanical, electrical and optical devices, the said substrate materials containing silicon oxide dielectric and polysilicon films, optionally containing silicon nitride films.

SUMMARY OF THE INVENTION

Accordingly, a novel aqueous polishing composition has been found, the said aqueous polishing composition comprising
(A) at least one type of abrasive particles containing or consisting of ceria; and
(B) at least one amphiphilic nonionic surfactant selected from the group consisting of water-soluble and water-dispersible, linear and branched polyoxyalkylene blockcopolymers of the general formula I:

$$R[(B1)_m/(B2)_nY]_p \qquad (I),$$

wherein the indices and the variables have the following meaning:
m integer≥1;
n integer≥1;
p integer≥1;
R hydrogen atom or monovalent or polyvalent organic residue, except linear and branched alkyl groups having 5 to 20 carbon atoms;
(B1) block consisting essentially of oxyethylene monomer units;
(B2) block consisting essentially of at least one type of substituted oxyalkylene monomer units wherein the substituents are selected from the group consisting of at least two methyl groups, alkyl groups having at least two carbon atoms and cycloalkyl, aryl, alkyl-cycloalkyl, alkyl-aryl, cycloalkyl-aryl and alkyl-cycloalkyl-aryl groups; and
Y hydrogen atom or monovalent organic residue, except linear and branched alkyl groups having 5 to 20 carbon atoms;
with the proviso that when (B) contains more than one block (B1) or (B2) two blocks of the same type are separated from each other by a block of the other type.

Hereinafter, the novel aqueous polishing composition is referred to as the "composition of the invention".

Moreover, the novel process for polishing substrates for mechanical, electrical and optical devices by contacting the substrate material at least once with the composition of the invention and polishing the substrate material until the desired planarity is achieved, has been found Hereinafter, the novel process for polishing substrate materials for mechanical, electrical and optical devices is referred to as the "process of the invention".

Advantages of the Invention

In view of the prior art, it was surprising and could not be expected by the skilled artisan that the objects of the present invention could be solved by the composition of the invention and the process of the invention.

It was particularly surprising that the composition of the invention exhibited a significantly improved oxide-to-polysilicon selectivity and yield polished wafers having an excellent global and local planarity as exemplified by the within-wafer nonuniformity (WIWNU) and the wafer-to-wafer nonuniformity (WTWNU). Therefore, they were excellently suited for manufacturing IC architectures, in particular ICs with LSI (large-scale integration) or VLSI (very-large-scale integration), having structures with dimensions below 50 nm.

Most particularly, the composition of the invention also exhibited an advantageous nitride-to-polysilicon selectivity coupled with an advantageous oxide-to-nitride selectivity.

Additionally, the composition of the invention was stable during prolonged transport and storage, which stability significantly improved the logistics and the process management.

Moreover, the composition of the invention was not only exceptionally useful in the field of integrated circuit devices, but was also most efficiently and advantageously useful in the fields of manufacturing other electrical devices such as liquid crystal panels, organic electroluminescent panels, printed circuit boards, micro machines, DNA chips, micro plants and magnetic heads; as well as high precision mechanical devices and optical devices, in particular, optical glasses such as photo-masks, lenses and prisms, inorganic electro-conductive films such as indium tin oxide (ITO), optical integrated circuits, optical switching elements, optical waveguides, optical monocrystals such as the end faces of optical fibers and scintillators, solid laser monocrystals, sapphire substrates for blue laser LEDs, semiconductor monocrystals, and glass substrates for magnetic disks.

Therefore, the composition of the invention was most particularly useful for the process of the invention. The process of invention could be most advantageously used for polishing, in particular chemically mechanically polishing, substrate materials for electrical devices such as liquid crystal panels, organic electroluminescent panels, printed circuit boards, micro machines, DNA chips, micro plants and magnetic heads; as well as substrate materials for high precision mechanical devices and optical devices, in particular, optical glasses such as photo-masks, lenses and prisms, inorganic electro-conductive films such as indium tin oxide (ITO), optical integrated circuits, optical switching elements, optical waveguides, optical monocrystals such as the end faces of optical fibers and scintillators, solid laser monocrystals, sapphire substrates for blue laser LEDs, semiconductor monocrystals, and glass substrates for magnetic disks.

Most particularly however, the process of the invention was excellently suited for polishing semiconductor wafers containing silicon oxide dielectric and polysilicon films and optionally containing silicon nitride films. The process of the invention yielded polished wafers having an excellent global and local planarity and balance without dishing, cupping or hotspots as exemplified by the within-wafer nonuniformity (WIWNU) and the wafer-to-wafer nonuniformity (WTWNU). Therefore, they were excellently suited for manufacturing IC architectures, in particular ICs with LSI (large-scale integration) or VLSI (very-large-scale integration), having structures with dimensions below 50 nm.

DETAILED DESCRIPTION OF THE INVENTION

The composition of the invention is an aqueous composition. This means that it contains water, in particular ultrapure water, as the main solvent and dispersing agent. Nevertheless, the composition of the invention may contain at least one water-miscible organic solvent, however, only in minor amounts that do not change the aqueous nature of the composition of the invention.

Preferably, the composition of the invention contains water in amounts of from 60 to 99.95% by weight, more preferably 70 to 99.9% by weight, even more preferably 80 to 99.9% by weight and, most preferably, 90 to 99.9% by weight, the weight percentages being based on the complete weight of the composition of the invention.

"Water-soluble" means that the relevant component or ingredient of the composition of the invention can be dissolved in the aqueous phase on the molecular level.

"Water-dispersible" means that the relevant component or ingredient of the composition of the invention can be dispersed in the aqueous phase and forms a stable emulsion or suspension.

The first essential ingredient of the composition of the invention is at least one, preferably one, type of abrasive particles (A) containing or consisting of ceria.

The average particle size of the abrasive particles (A) can vary broadly and, therefore, can be adjusted most advantageously to the particular requirements of a given composition and process of the invention. Preferably, the average particle size as determined by dynamic laser light scattering is in the range of from 1 to 2000 nm, preferably 1 to 1000 nm, more preferably 1 to 750, most preferably 1 to 500 nm, particularly 10 to 250 nm, for example 80 to 200 nm.

The particle size distribution of the abrasive particles (A) can be monomodal, bimodal or multimodal. Preferably, the particle size distribution is monomodal in order to have an easily reproducible property profile of the abrasive particles (A) and easily reproducible conditions during the process of the invention.

Moreover, the particle size distribution of the abrasive particles (A) can be narrow or broad. Preferably, the particle size distribution is narrow with only small amounts of small particles and large particles in order to have an easily reproducible property profile of the abrasive particles (A) and easily reproducible conditions during the process of the invention.

The abrasive particles (A) can have various shapes. Thus, they may be of one or essentially one type of shape. However, it also possible that the abrasive particles (A) have different shapes. In particular, two types of differently shaped abrasive particles (A) may be present in a given composition of the invention. As regards the shapes themselves, they can be cubes, cubes with chamfered edges, octahedrons, icosahedrons, nodules and spheres with or without protrusions or indentations. Most preferably, the shape is spherical with no or only very few protrusions or indentations. This shape, as a rule, is preferred because it usually increases the resistance to the mechanical forces the abrasive particles (A) are exposed to during a CMP process.

The abrasive particles (A) which contain ceria can contain minor amounts of other rare earth metal oxides.

The abrasive particles (A) which consist of ceria can have a hexagonal, cubic or face-centered cubic crystal lattice.

Preferably, the abrasive particles (A) which contain ceria are composite particles (A) comprising a core containing or consisting of at least one other abrasive particulate material which is different from ceria, in particular alumina, silica, titania, zirconia, zinc oxide, and mixtures thereof.

Such composite particles (A) are known, for example, from WO 2005/035688 A1, U.S. Pat. No. 6,110,396, U.S. Pat. No. 6,238,469 B1, U.S. Pat. No. 6,645,265 B1, K. S. Choi et al., Mat. Res. Soc. Symp. Proc., Vol. 671, 2001 Materials Research Society, M5.8.1 to M5.8.10, S.-H. Lee et al., J. Mater. Res., Vol. 17, No. 10 (2002), pages 2744 to 2749, A. Jindal et al., Journal of the Electrochemical Society, 150 (5), G314-G318 (2003), Z. Lu, Journal of Materials Research, Vol. 18, No. 10, October 2003, Materials Research Society, or S. Hedge et al., Electrochemical and Solid-State Letters, 7 (12), G316-G318 (2004).

Most preferably, the composite particles (A) are raspberry-type coated particles comprising a core selected from the group consisting of alumina, silica titania, zirconia, zinc oxide, and mixtures thereof with a core size of from 20 to 100 nm wherein the core is coated with ceria particles having a particle size below 10 nm.

The amount of the abrasive particles (A) used in the composition of the invention can vary broadly and, therefore, can be adjusted most advantageously to the particular requirements of a given composition and process of the invention. Preferably, the composition of the invention contains 0.005 to 10% by weight, more preferably, 0.01 to 8% by weight and, most preferably, 0.01 to 6% by weight of the abrasive particles (A), the weight percentages being based on the complete weight of the composition of the invention.

The second essential ingredient of the composition of the invention is at least one, preferably one, amphiphilic nonionic surfactant (B) which is selected from the group consisting of water-soluble and water-dispersible, preferably water-soluble, linear and branched, preferably linear, polyoxyalkylene blockcopolymers of the general formula I:

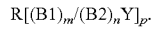

$R[(B1)_m/(B2)_n Y]_p$.

In the general formula I, the indices m and n are independently of each other integers equal to or greater than 1, preferably, integers of from 1 to 10, more preferably, 1 to 5 and, most preferably, 1 to 3.

The index p of the general formula I is an integer equal to or greater than 1, preferably, integers of from 1 to 100, more preferably, 1 to 50, even more preferably, 1 to 25 and, most preferably, 1 to 10.

The variable R stands for a hydrogen atom or a monovalent or polyvalent organic residue, except linear and branched alkyl groups having 5 to 20 carbon atoms.

Preferably, the monovalent or polyvalent organic residue R is selected from the group consisting of alkyl groups having 1 to 4 and 21 to 30 carbon atoms and cycloalkyl, aryl, alkyl-cycloalkyl, alkyl-aryl, cycloalkyl-aryl and alkyl-cycloalkyl-aryl groups.

More preferably, the monovalent or polyvalent organic residues R are derived from monohydroxy and polyhydroxy compounds R'.

Examples of suitable monohydroxy compounds R' are methanol, ethanol, propanol, isopropanol, n-, sec- and tert-butanol, monoalcohols derived from linear and branched heneicosane docosane tricosane tetracosane pentacosane, hexacosane, heptacosane, octacosane, nonacosane and triacontanne, cyclohexanol benzyl alcohol phenol and phenols having an alkyl group of 4 to 16 carbon atoms in their 4-position.

Examples of suitable dihydroxy compounds R' are ethylene glycol, propylene glycol, butylene glycol, pentylene glycol, hexylene glycol, diethylene glycol, triethylene glycol, dipropylene glycol, tripropylene glycol, ethylene propylene glycol, diethylene propylene glycol, ethylene dipropylene glycol, 1,2-, 1,3- and 1,4-dihydroxy cyclohexane and benzene and bisphenol A and F.

Examples of suitable trihydroxy compounds R' are glycerol, 1,2,3-trihydroxy-n-butane, trimethylolpropane, 1,2,3-, 1,2,4- and 1,3,5-trihydroxy cyclohexane and benzene.

Examples of suitable polyhydroxy compounds R' are pentaerythritol, 1,2,3,4-, 1,2,3,5- and 1,2,4,5-tetrahydroxy cyclohexane and benzene, polyvinyl alcohols, poly(hydroxystyrenes) alditols, cyclitols, carbohydrates and dimers and oligomers of glycerol, trimethylolpropane, pentaerythritol, alditols and cyclitols.

Examples of suitable alditols R' are tetritols, pentitols, hexitols, heptitols, and octitols, in particular, erythritol, threitol, arabinitol, ribitol, xylitol, galactitol, mannitol, glucitol, allitol, altritol and iditol.

Examples of suitable dimers R' are dimers of glycerol, trimethylolpropane, erythritol, threitol and pentaerythritol, maltitol, isomalt and lactitol, in particular, tri-, tetra-, penta-, hexa-, hepta-, octa-, nona-, deca-, undeca- and dodecaglycerol, -trimethylolpropane, -erythritol, -threitol and -pentaerythritol.

Examples of suitable cyclitols R' are 1,2,3,4,5-pentahydroxycyclohexane and inositols, in particular myo-, scyllo-, muco-, chiro-, neo-, allo-, epi- and cis-inositol.

Examples of suitable carbohydrates R' are monosaccharides, disaccharides, oligosaccharides, polysaccharides, desoxy sugars and amino sugars, in particular, monosaccharides.

Examples of suitable monosaccharides R' are allose, altrose, glucose, mannose, idose, galactose and talose.

The residues R other than a hydrogen atom can carry at least one inert substituent. "Inert" means that the substituents do not initiate the polymerization of ethylene oxide and the alkylene oxides and undesirable reactions such as the decomposition and/or sedimentation of components of the composition of the invention upon prolonged storage and during the process of the invention. Examples of suitable inert substituents are halogen atoms, in particular, fluorine and chlorine atoms, nitro groups, nitrile groups and alkyl, cycloalkyl and aryl groups linked with the residue R via oxygen or sulfur atoms, carboxy groups, sulfoxy groups, sulfo groups, carboxylic, sulfonic and phosphonic acid ester groups or urethane groups. The inert substituents are used in such amounts that they do not adversely affect the hydrophilic-lipophilic balance (HLB) value of the surfactant (B). Preferably, the substituents do not carry such inert substituents.

Most preferably, the residue R is a hydrogen atom.

The amphiphilic nonionic surfactant (B) of the general formula I contains of at least one block (B1) and at least one block (B2), with the proviso that when (B) contains more than one block (B1) and (B2) two blocks of the same type are separated from each other by a block of the other type.

Therefore, the amphiphilic nonionic surfactant (B) can contain various general blocklike structures such as B1-B2;
B1-B2-B1;
B2-B1-B2;
B1-B2-B1-B2;
B1-B2-B1-B2-B1;
B2-B1-B2-B1-B2;
B1-B2-B1-B2-B1-B2;
B1-B2-B1-B2-B1-B2-B1, and
B2-B1-B2-B1-B2-B1-B2.

If two or more blocks (B1) are present, they can have the same or essentially the same composition, molecular weight and HLB value or they can be different from each other. This equally applies to the blocks (B2).

Preferably, the amphiphilic nonionic surfactant (B) contains the general blocklike structures B1-B2, B1-B2-B1 or B2-B1-B2.

The block (B1) consists essentially of oxyethylene monomer units. "Consisting essentially of" means that the block (B1) consists entirely of oxyethylene monomer units or contains minor amounts of oxypropylene monomer units and/or oxyalkylene monomer units, i.e., the monomer units of the blocks (B2). "Minor amounts" means that the concentration of the monomer units other than the oxyethylene monomer units is so low that the chemical and physicochemical properties, in particular the hydrophilic nature, of the block (B1) caused by the oxyethylene monomer units are not negatively affected but advantageously modified.

Independent from the average degree of polymerization of the block (B2), the average degree of the polymerization of the block (B1) can vary broadly and, therefore, can be adapted most advantageously to the particular requirements of a given composition and process of the invention. Preferably, the average degree of polymerization is in the range of from 5 to 100, more preferably, 5 to 75 and, most preferably, 5 to 50.

The block (B2) consists essentially of at least one, preferably one, type of substituted oxyalkylene monomer units wherein the substituents are selected from the group consisting of at least two methyl groups, alkyl groups having at least two carbon atoms and cycloalkyl, aryl, alkyl-cycloalkyl, alkyl-aryl, cycloalkyl-aryl and alkyl-cycloalkyl-aryl groups.

"Consisting essentially of" means that the block (B2) consists entirely of the said oxyalkylene monomer units or contains minor amounts of oxypropylene and/or oxyethylene monomer units. "Minor amounts" means that the concentration of the oxyethylene and/or oxypropylene monomer units is so low that the chemical and physicochemical properties, in particular the lipophilic nature, of the block (B2) caused by the oxyalkylene monomer units are not negatively affected but advantageously modified.

Preferably, the oxyalkylene monomer units of the block (B2) are derived from substituted oxiranes wherein the substituents are selected from the group consisting of at least two methyl groups and alkyl groups having at least two carbon atoms and cycloalkyl, aryl, alkyl-cycloalkyl, alkyl-aryl, cycloalkyl-aryl and alkyl-cycloalkyl-aryl groups.

More preferably the substituents are selected from the group consisting of at least two methyl groups, alkyl groups having 2 to 10 carbon atoms, cycloalkyl groups having 5 to 10 carbon atoms in spirocyclic, exocyclic and/or annealed configuration, aryl groups having 6 to 10 carbon atoms, alkyl-cycloalkyl groups having 6 to 20 carbon atoms, alkyl-aryl groups having 7 to 20 carbon atoms, cycloalkyl-aryl group 11 to 20 carbon atoms and alkyl-cycloalkyl-aryl groups having 12 to 30 carbon atoms.

Examples of suitable alkyl groups are two methyl groups and ethyl, propyl, isopropyl, n-butyl, sec-butyl, tert-butyl, n-pentyl, 2,2-dimethylprop-1-yl, n-hexyl, 2-, 3- and 4-methylpent-1-yl, 2,2- and 3,3-dimethylbut-1-yl, n-heptyl, 2,3-dimethylpent-1-yl, 2,3,3-trimethylbut-1-yl, n-octyl, isooctyl, 2-ethylhexyl, n-nonyl, 2-ethyl-3,4-dimethylpent-1-yl, and n-decyl; preferably, methyl, ethyl, propyl, isopropyl, n-butyl, n-pentyl, and n-hexyl groups.

Examples of suitable cycloalkyl groups are cyclopentyl, cyclohexyl, cyclopentane-1,1-diyl, cyclopentane-1,2-diyl, cyclohexane-1,1-diyl, and cyclohexane-1,2-diylgroups.

Examples of suitable aryl groups are phenyl and 1- and 2-naphthyl groups.

Examples of suitable alkyl-cycloalkyl groups are cyclopentyl- and cyclohexylmethyl, 2-cyclopentyl- and 2-cyclohexylethy-1-yl, 3-cyclopentyl- and 3-cyclohexylprop-1-yl, and 4-cyclopentyl- and 4-cyclohexyl-n-but-1-yl groups.

Examples of suitable alkyl-aryl groups are phenylmethyl, 2-phenyleth-1-yl, 3-phenylprop-1-yl, and 4-phenyl-n-but-1-yl groups.

Examples of suitable cycloalkyl-aryl groups are 4-phenylcyclohex-1-yl, 4-cyclohexyl-phen-1-yl, and 2,3-dihydroindene-1,2-diyl groups.

Examples of suitable alkyl-cycloalkyl-aryl groups are cyclohexyl-phenyl-methyl and 2-cyclohexyl-2-phenyl-eth-1-yl groups.

Examples for particularly preferred substituted oxiranes are ethyl, 2,2- and 2,3-dimethyl, 2,2,3-trimethyl, 2,2,3,3-tetramethyl, 2-methyl-3-ethyl, 2,2- and 2,3-diethyl, n-propyl, 2-methyl-3-n-propyl, n-butyl, n-pentyl, n-hexyl, n-heptyl, n-octyl, n-nonyl, n-decyl, cyclopentyl, cyclohexyl, phenyl, and naphthyl oxirane; 1,2-epoxy-cyclohexane and -cyclopentane; 1-oxa-3-spiro[3.4]-heptane and 1-oxa-3-spiro[3.5]-octane; and 1,2-epoxy-2,3-dihydroindene.

Most preferably, the substituted oxirane is selected from the group consisting of 2-ethyl, 2,3-dimethyl and 2,2-dimethyl oxirane, particularly preferably, 2-ethyl oxirane and 2,3-dimethyl oxirane.

Therefore, the oxyalkylene monomer units particularly preferably used are selected from oxybut-1,2-ylene, —CH($C_2H_5$)—$CH_2$—O—, and oxybut-2,3-ylene, —CH($CH_3$)—CH($CH_3$)—O—. Independent from the average degree of polymerization of the block (B1), the average degree of the polymerization of the block (B2) can vary broadly and, therefore, can be adapted most advantageously to the particular requirements of the composition and the process of the invention. Preferably, the average degree of polymerization is in the range of from 5 to 100, more preferably, 5 to 75 and, most preferably, 5 to 50.

The variable Y stands for a hydrogen atom or a monovalent organic residue, except linear and branched alkyl groups having 5 to 20 carbon atoms.

Preferably, the monovalent organic residue Y is selected from the group consisting of alkyl groups having 1 to 4 and 21 to 30 carbon atoms and cycloalkyl, aryl, alkyl-cycloalkyl, alkyl-aryl, cycloalkyl-aryl and alkyl-cycloalkyl-aryl groups.

More preferably, the monovalent residues Y are selected from the group consisting of methy, ethyl, propyl, isopropyl, n-, sec- and tert-butyl, linear and branched heneicosanyl docosanyl tricosanyl tetracosanyl pentacosanyl, hexacosanyl, heptacosanyl, octacosanyl, nonacosanyl and triacontanyl, cyclohexyl, benzyl and phenyl groups and phenyl grpups having an alkyl group of 4 to 16 carbon atoms in their 4-position.

Preferably the monovalent residue Y is a hydrogen atom.

The hydrophilic-lipophilic balance (HLB) value of amphiphilic nonionic surfactant (B) can vary broadly and, therefore, can be adapted most advantageously to the particular requirements of a given composition and process of the invention. Preferably, the HLB value is in the range of from 3 to 20 and, most preferably, 4 to 18.

The surface tension of the amphiphilic nonionic surfactant (B) can also vary broadly and, therefore, can be adapted most advantageously to the particular requirements of a given composition and process of the invention. Preferably, the surface tension is in the range of from 20 to 60, more preferably 25 to 55 and, most preferably 25 to 50 dyne/cm at 25° C.

The weight average molecular weight of the amphiphilic nonionic surfactant (B) can also vary broadly and, therefore, can be adapted most advantageously to the particular requirements of a given composition and process of the invention. Preferably, the weight average molecular weight is in the range of from 1000 to 10,000 and, most preferably 1100 to 8000 Dalton, particularly 1100 to 3500 Dalton.

The preparation of the amphiphilic anionic surfactants (B) offer no chemical and methodic particularities but they can be carried out in accordance with customary and known methods, as for example, the anionic ring-opening polymerization of suitable oxiranes or the polycondensation of suitable epichlorohydrines using the aforementioned mono- and polyhydroxy compounds R' as starter molecules or no such starter molecules.

The concentration of the amphiphilic nonionic surfactant (B) in the composition of the invention can vary broadly and, therefore, can be adjusted most advantageously to the particular requirements of a given composition and process of the invention. Preferably, the composition of the invention contains the amphiphilic nonionic surfactant (B) in amounts of from 0.001 to 5% by weight, more preferably, 0.005 to 2.5% by weight, even more preferably, 0.0075 to 1% by weight and, most preferably, 0.0075 to 0.5% by weight.

The composition of the invention can contain at least one functional component (D) which is different from the ingredients or components (A), (B) and (C).

Preferably, the functional component (D) is selected from the group of compounds customarily used in ceria-based CMP slurries. Examples of such compounds (D) are disclosed, for example, by Y. N. Prasad et al. in Electrochemical and Solid-State Letters, 9 (12), G337-G339 (2006), Hyun-Goo Kang et al. in Journal of Material Research, volume 22, No. 3, 2007, pages 777 to 787, S. Kim et al. in Journal of Colloid and Interface Science, 319 (2008), pages 48 to 52, S. V. Babu et al. in Electrochemical and Solid-State Letters, 7 (12), G327-G330 (2004), Jae-Dong Lee et al. in Journal of the Electrochemical Society, 149 (8), G477-G481, 2002, the American patents U.S. Pat. No. 5,738,800, U.S. Pat. No. 6,042,741, U.S. Pat. No. 6,132,637, U.S. Pat. No. 6,218,305 B, U.S. Pat. No. 5,759,917, U.S. Pat. No. 6,689,692 B1, U.S. Pat. No. 6,984,588 B2, U.S. Pat. No. 6,299,659 B1, U.S. Pat. No. 6,626,968 B2, U.S. Pat. No. 6,436,835, B1 U.S. Pat. No. 6,491,843 B1, U.S. Pat. No. 6,544,892 B2, U.S. Pat. No. 6,627,107 B2, U.S. Pat. No. 6,616,514 B1, and U.S. Pat. No. 7,071,105 B2, the American patent applications US 2002/0034875 A1, US 2006/0144824 A1, US 2006/0207188 A1, US 2006/0216935 A1, US 2007/0077865 A1, US 2007/0175104 A1, US 2007/0191244 A1 and US 2007/0218811 A1, and the Japanese patent application JP 2005-336400 A.

Moreover, the functional component (D) is selected from the group consisting of organic, inorganic and hybrid organic-inorganic abrasive particles being different from the particles (D), materials having a lower critical solution temperature LOST or an upper critical solution temperature UCST, oxidizing agents, passivating agents, charge reversal agents, organic polyols having at least 3 hydroxide groups that are not dissociable in the aqueous medium, oligomers and polymers formed from at least one monomer having at least 3 hydroxide groups that are not dissociable in the aqueous medium, complexing or chelating agents, frictive agents, stabilizing agents, rheology agents, surfactants, metal cations, anti-microbial agents or biocides and organic solvents.

Suitable organic abrasive particles (D) and their effective amounts are known, for example, from the American patent application US 2008/0254628 A1, page 4, paragraph [0054] or from the international application WO 2005/014753 A1, wherein solid particles consisting of melamine and melamine derivatives such as acetoguanamine, benzoguanamine and dicyandiamide are disclosed.

Suitable inorganic abrasive particles (D) and their effective amounts are known, for example, from the international patent application WO 2005/014753 A1, page 12, lines 1 to 8 or the American patent U.S. Pat. No. 6,068,787, column 6, line 41 to column 7, line 65.

Suitable hybrid organic-inorganic abrasive particles (D) and their effective amounts are known, for example, from the American patent applications US 2008/0254628 A1, page 4, paragraph [0054] or US 2009/0013609 A1, page 3, paragraph [0047] to page 6, paragraph [0087].

Suitable oxidizing agents (D) and their effective amounts are known, for example, from the European patent application EP 1 036 836 A1, page 8, paragraphs [0074] and [0075] or from the U.S. Pat. No. 6,068,787, column 4, line 40 to column 7, line 45 or U.S. Pat. No. 7,300,601 B2, column 4, lines 18 to 34. Preferably, organic and inorganic peroxides, more preferably inorganic peroxides, are used. In particular, hydrogen peroxide is used.

Suitable passivating agents (D) and their effective amounts are known, for example, from the U.S. Pat. No. 7,300,601 B2, column 3, line 59 to column 4, line 9 or from the American patent application US 2008/0254628 A1, the paragraph [0058] bridging the pages 4 and 5.

Suitable complexing or chelating agents (D), which are sometimes also designated as frictive agents (cf. the American patent application US 2008/0254628 A1, page 5, paragraph [0061]) or etching agents or etchants (cf. the American patent application US 2008/0254628 A1, page 4, paragrap [0054]), and their effective amounts are known, for example, from the U.S. Pat. No. 7,300,601 B2, column 4, lines with 35 to 48. The amino acids, in particular glycine, and, moreover, dicyandiamide and triazines containing at least one, preferably two and, more preferably, three primary amino groups such as melamine and water-soluble guanamines, particularly melamine, formoguanamine, acetoguanamine and 2,4-diamino-6-ethyl-1,3,5-triazine, are most particularly preferably used.

Suitable stabilizing agents (D) and their effective amounts are known, for example, from the U.S. Pat. No. 6,068,787, column 8, lines 4 to 56.

Suitable rheology agents (D) and their effective amounts are known, for example, from the American patent application US 2008/0254628 A1, page 5, paragraph [0065] to page 6, paragraph [0069].

Suitable surfactants (D) and their effective amounts are known, for example, from the international patent application WO 2005/014753 A1, page 8, line 23, to page 10, line 17 or from the U.S. Pat. No. 7,300,601 B2, column 5, line 4 to column 6, line 8.

Preferred surfactants (D) are nonionic surfactants selected from the group consisting of linear and branched alkylene oxide, preferably ethyleneoxide and propyleneoxide, homopolymers and copolymers.

The preferred ethyleneoxide-propyleneoxide copolymers (D) can be random copolymers, alternating copolymers or blockcopolymers containing polyethyleneoxide blocks and polypropyleneoxide blocks.

Preferably, in the ethyleneoxide-propyleneoxide blockcopolymers (D), the polyethyleneoxide blocks have hydrophilic-lipophilic-balance (HLB) values from 10 to 15. The polypropyleneoxide blocks may have a HLB values of from 28 to about 32

The preferred surfactants (D) are customary and known, commercially available materials and are described in the European patent EP 1 534 795 B1, page 3, paragraph [0013] to page 4, paragraph [0023], the Japanese patent application JP 2001-240850 A, claim 2 in conjunction with the paragraphs [0007] to [0014], the American patent application US 2007/0077865 A1, column page 1, paragraph [0008] to page 2, paragraph [0010], the American patent application US 2006/0124594 A1, page 3, paragraphs [0036] and [0037] and the American patent application US 2008/0124913 A1, page 3, paragraphs [0031] to [0033] in conjunction with the claim 14 or they are sold under the trademarks Pluronic™, Tetronic™ and Basensol™ by BASF Corporation and BASF SE as evidenced by the company brochure of BASF Corporation "Pluronic™ & Tetronic™ Block Copolymer Surfactants, 1996" or the American patent US 2006/0213780 A1.

Most preferably, polyethylene glycol (PEG) is used as nonionic surfactant (D).

Suitable polyvalent metal ions (D) and their effective amounts are known, for example, from the European patent application EP 1 036 836 A1, page 8, paragraph [0076] to page 9, paragraph [0078].

Suitable organic solvents (D) and their effective amounts are known, for example, from the U.S. Pat. No. 7,361,603 B2, column 7, lines 32 to 48 or the American patent application US 2008/0254628 A1, page 5, paragraph [0059].

Suitable anti-microbial agents or biocides (D) are N-substituted diazenium dioxides and N'-hydroxy-diazenium oxide salts.

Suitable materials (D) exhibiting a lower critical solution temperature LCST or an upper critical solution temperature UCST are described, for example, in the article of H. Mori, H. Iwaya, A. Nagai and T. Endo, Controlled synthesis of thermoresponsive polymers derived from L-proline via RAFT polymerization, in Chemical Communication, 2005, 4872-4874; or in the article of D. Schmaljohann, Thermo- and pH-responsive polymers and drug delivery, Advanced Drug Delivery Reviews, volume 58 (2006), 1655-1670 or in the American patent applications US 2002/0198328 A1, US 2004/0209095 A1, US 2004/0217009 A1, US 2006/0141254 A1, US 2007/0029198 A1, US 2007/0289875 A1, US 2008/0249210 A1, US 2008/0050435 A1 or US 2009/0013609 A1, the U.S. Pat. No. 5,057,560, U.S. Pat. No. 5,788,82 and US6,682,642 B2, the international patent applications WO 01/60926 A1, WO2004/029160 A1, WO 2004/0521946 A1, WO 2006/093242 A2 or WO 2007/012763 A1, in the European patent applications EP 0 583 814 A1, EP 1 197 587 B1 and EP 1 942 179 A1, or the German patent application DE 26 10 705.

In principle, any known charge reversal agent (D) customarily used in the field of CMP can be used. Preferably, the charge reversal agent (D) is selected from the group consisting of monomeric, oligomeric and polymeric compounds containing at least one anionic group selected from the group consisting of carboxylate, sulfinate, sulfate, phosphonate and phosphate groups.

Preferably, anionic phosphate dispersing agents, in particular water-soluble condensed phosphates, are used as the charge reversal agents (D).

Examples of suitable water-soluble condensed phosphates (D) are salts, in particular ammonium, sodium and potassium salts, of metaphosphates of the general formula I:

and polyphosphates of the general formula II and III:

wherein M is an ammonium, sodium or potassium cation and the index n is from 2 to 10,000.

Examples for particularly suitable water-soluble condensed phosphates (D) are Graham's salt $(NaPO_3)_{40-50}$, Calgon™ $(NaPO_3)_{15-20}$, Kurrol's salt $(NaPO_3)_n$ with n=about 5000, and ammonium, sodium and potassium hexametaphosphate.

The concentration of the water-soluble anionic phosphate dispersing agent (D) in the composition of the invention can vary broadly and, therefore, can be adjusted most advantageously to the particular requirements of a given composition and process of the invention. Preferably, the anionic phosphate dispersing agents (D) is used in amounts so that a weight ratio of ceria (A) to anionic phosphate dispersing agent (D) of 10 to 2000 and, more preferably, 20 to 1000 results.

If present, the functional component (D) can be contained in varying amounts. Preferably, the total amount of (D) is not more than 10 wt. % ("wt. %" means "percent by weight"), more preferably not more than 2 wt. %, most preferably not more than 0.5 wt. %, particularly not more than 0.1 wt. %, for example not more than 0.01 wt. %, based on the total weight of 30 the corresponding CMP composition. Preferably, the total amount of (D) is at least 0.0001 wt. %, more preferably at least 0.001 wt. %, most preferably at least 0.008 wt. %, particularly at least 0.05 wt. %, for example at least 0.3 wt. %, based on the total weight of the corresponding composition.

The composition of the invention can optionally contain at least one pH-adjusting agent or buffering agent (E) which is materially different from the ingredients (A), (B) and (C).

Suitable pH-adjusting agents or buffering agents (E) and their effective amounts are known, for example, from the European patent application EP 1 036 836 A1, page 8, paragraphs [0080], [0085] and [0086], the international patent application WO 2005/014753 A1, page 12, lines 19 to 24, the American patent application US 2008/0254628 A1, page 6, paragraph [0073] or the U.S. Pat. No. 7,300,601 B2, column 5, lines 33 to 63. Examples for pH-adjusting agents or buffering agents (E) are potassium hydroxide, ammonium hydroxide, tetramethylammonium hydroxide (TMAH), nitric acid, and sulfuric acid.

If present, the pH-adjusting agent or buffering agent (E) can be contained in varying amounts. Preferably, the total amount of (E) is not more than 20 wt. %, more preferably not more than 7 wt. %, most preferably not more than 2 wt. %, particularly not more than 0.5 wt. %, for example not more than 0.1 wt. %, based on the total weight of the corresponding CMP composition. Preferably, the total amount of (E) is at least 0.001 wt. %, more preferably at least 0.01 wt. %, most preferably at least 0.05 wt. %, particularly at least 0.1 wt. %, for example at least 0.5 wt. %, based on the total weight of the corresponding composition.

Preferably, the pH of the composition of the invention is set between 3 and 10, more preferably, 3 and 8, even more preferably between 3 and 7, and, most preferably between 5 and 7 preferably using the aforementioned pH-adjusting agents (E).

The preparation of the composition of the invention does not exhibit any particularities but can be carried out by dissolving or dispersing the above-described ingredients (A), (B) and (C) and optionally (D) and/or (E) in an aqueous medium, in particular, de-ionized water. For this purpose, the customary and standard mixing processes and mixing apparatuses such as agitated vessels, in-line dissolvers, high shear impellers, ultrasonic mixers, homogenizer nozzles or counterflow mixers, can be used. Preferably, the composition of the invention thus obtained can be filtered through filters of the appropriate mesh aperture, in order to remove coarse-grained particles such as the agglomerates or aggregates of the solid, finely dispersed abrasive particles (A).

The compositions of the invention are excellently suited for the process of the invention.

In the process of the invention, a substrate for electrical, mechanical and optical devices, in particular, electrical devices, most preferably, integrated circuit devices, is contacted at least once with a composition of the invention and polished, in particular, chemically and mechanically polished, until the desired planarity is achieved.

The process on the invention exhibits its particular advantages in the CMP of silicon semiconductor wafers having at least one dielectric isolating film consisting of at least one, preferably one, silicon oxide dielectric material, and at least one film consisting of polysilicon.

Preferably, silicon oxide dielectric material is selected from the group consisting of silicon dioxide and low-k and ultra-low-k silicon oxide materials.

Optionally, the silicon semiconductor wafers have at least one silicon nitride film.

Suitable silicon dioxide materials can be preprepared by low-pressure and high-pressure plasma chemical vapor deposition (LDP or HDP CVD) using monosilane-oxygen or tetraethylorthosilicate (TEOS)-oxygen plasmas as described in, for example, the American patent application US 2007/0175104 A1, page 7, paragraph [0092].

Suitable low-k or ultra-low-k materials and suitable methods of preparing the insulating dielectric films are described, for example, in the American patent applications US 2005/0176259 A1, page 2, paragraphs [0025] to [0027], US 2005/0014667 A1, page 1, paragraph [0003], US 2005/0266683 A1, page 1, paragraph [0003] and page 2, paragraph [0024] or US 2008/0280452 A1, paragraphs [0024] to [0026] or in the U.S. Pat. No. 7,250,391 B2, column 1, lines 49 to 54 or in the European patent application EP 1 306 415 A2, page 4, paragraph [0031].

The process of the invention is particularly suited for the shallow trench isolation (STI) which requires the selective removal of dielectric silicon oxide material over polysilicon on a patterned wafer substrate. In this process, etched trenches are overfilled with the dielectric silicon oxide material, e.g., silicon dioxide, which is polished using the polysilicon film as the barrier or stopping film. In this preferred embodiment, the process of the invention ends with clearing the silicon dioxide from the barrier film while minimizing the removal of exposed polysilicon and trench silicon dioxide.

Moreover, the process of the invention is also particularly well-suited for the shallow trench isolation (STI) wherein a silicon nitride film is also present, because the composition of the invention exhibits not only a high oxide-to-polysilicon selectivity but also an advantageous nitride-to-polysilicon selectivity and an advantageous oxide-to-nitride selectivity.

The process of the invention exhibits no particularities but can be carried out with the processes and the equipment customarily used for the CMP in the fabrication of semiconductor wafers with ICs.

As is known in the art, a typical equipment for the CMP consists of a rotating platen which is covered with a polishing pad. The wafer is mounted on a carrier or chuck with its upper side down facing the polishing pad. The carrier secures the wafer in the horizontal position. This particular arrangement of polishing and holding device is also known as the hard-platen design. The carrier may retain a carrier pad which lies between the retaining surface of the carrier and the surface of the wafer which is not being polished. This pad can operate as a cushion for the wafer.

Below the carrier, the larger diameter platen is also generally horizontally positioned and presents a surface parallel to that of the wafer to be polished. Its polishing pad contacts the wafer surface during the planarization process. During the CMP process of the invention, the composition of the invention is applied onto the polishing pad as a continuous stream or in dropwise fashion.

Both the carrier and the platen are caused to rotate around their respective shafts extending perpendicular from the carrier and the platen. The rotating carrier shaft may remain fixed in position relative to the rotating platen or may oscillate horizontally relative to the platen. The direction of rotation of the carrier typically, though not necessarily, is the same as that of the platen. The speeds of rotation for the carrier and the platen are generally, though not necessarily, set at different values.

Customarily, the temperature of the platen is set at temperatures between 10 and 70° C.

For further details reference is made to the international patent application WO 2004/063301 A1, in particular page 16, paragraph [0036] to page 18, paragraph [0040] in conjunction with the FIG. 1.

By way of the process of the invention semiconductor wafers with ICs comprising patterned polysilicon and dielectric silicon oxide films, in particular silicon dioxide films, having an excellent planarity can be obtained. Therefore, copper damascene patterns can be obtained which also have an excellent planarity and, in the finished, IC an excellent electrical functionality.

EXAMPLES OR COMPARATIVE EXPERIMENTS

Example 1

Preparation of the Aqueous Polishing Compositions 1 to 9 Containing an Amphiphilic Nonionic Surfactant (B) and of the Aqueous Polishing Composition 10 Containing No Amphiphilic Nonionic Surfactant (B)

For the preparation of the aqueous polishing compositions 1 to 10, ceria (average particle size d50 of 120 to 180 nm as determined by dynamic laser light scattering) and sodium hexametaphosphate (PP; weight ratio of ceria to PP=200:1, hereinafter designated as $PP_{200}$) were dispersed or dissolved in ultrapure water.

For the preparation of the aqueous polishing compositions 1 to 9, the amphiphilic nonionic surfactants (B) listed in the Table 1 were additionally added.

For the preparation of the aqueous polishing composition 10, no amphiphilic nonionic surfactant (B) was added.

The amounts of the components of the aqueous polishing compositions are compiled in the Table 2.

TABLE 1

The Amphiphilic Nonionic Surfactants (B) Used

| Surfactant (B) No. | Structure S | HLB Value | Cloud Point [c]/ ° C. (Method) | Weight Average Molecular Weight/Dalton |
|---|---|---|---|---|
| 1 | S1[a] | 4 | 50 (E) | 2000 |
| 2 | S1[a] | 10 | 76 (E) | 1700 |
| 3 | S1[a] | 16 | 94 (E) | 2400 |
| 4 | S1[a] | 10 | 87 (E) | 3100 |
| 5[d] | S1[a] | 16 | 87 (B) | 7700 |
| 6 | S2[b] | 10 | 72 (E) | 1700 |
| 7 | S1[a] | 12 | 82 (E) | 2000 |
| 8 | S1[a] | 6 | 45 (E) | 1200 |
| 9 | S1[a] | 8 | 60 (E) | 1400 |

[a] polyethyleneoxide-poly-1,2-butyleneoxide-polyethyleneoxide block copolymer;
[b] polyethyleneoxide-poly-2,3-butyleneoxide block copolymer;
[c] Method B: 1 g surfactant in 100 g of 5% by weight solution of sodium chloride in water; Method E: 5 g surfactant in 25 g of 25% by weight solution of butyldiglycol in water;
[d] surface tension 45.3 dyne/cm at 25° C.

TABLE 2

The Compositions of the Aqueous Polishing Compositions 1 to 10

| Composition No. | Ceria/% by weight | Surfactant (B) No./% by weight | $PP_{200}$ | pH |
|---|---|---|---|---|
| 1 | 0.5 | 1/0.01 | + | 6.5 |
| 2 | 0.5 | 2/0.01 | + | 6.5 |
| 3 | 0.5 | 3/0.01 | + | 6.3 |
| 4 | 0.5 | 4/0.01 | + | 6.2 |
| 5 | 0.5 | 5/0.01 | + | 6.2 |
| 6 | 0.5 | 6/0.01 | + | 6.2 |
| 7 | 0.5 | 7/0.01 | + | 6.2 |
| 8 | 0.5 | 8/0.01 | + | 6.2 |
| 9 | 0.5 | 9/0.01 | + | 6.2 |
| 10 (comparison) | 0.5 | — | + | 6.2 |

The aqueous polishing compositions 1 to 9 were excellently suited for the STI process.

Examples 2 to 9 and the Comparative Experiment C1

CMP of Silicon Dioxide, Silicon Nitride and Polysilicon Films on Silicon Semiconductor Wafers The aqueous polishing composition 1 to 9 of the example 1 were used for the examples 2 to 9.

The aqueous polishing composition 10 of the example 1 was used for the comparative experiment C1.

200 mm blanket silicon wafers having a high-density plasma deposited (HDP) silicon dioxide film, 200 mm blanket silicon wafers having a LPCVD silicon nitride film and 200 mm blanket silicon wafers having an amorphous polysilicon film were chemically mechanically polished with the aqueous polishing compositions 1 to 10 under the following conditions:

Polishing apparatus: AMAT Mirra (rotary type);
platen speed: 93 rpm;
carrier speed: 87 rpm;
polishing pad: IC1010-k groove pad;
pad conditioning: in-situ;
conditioner: 3M A166;
conditioning downforce: 5 lbf (22.24 N);
slurry flow rate: 160 ml/min;
polishing downforce: 3.5 psi (205 mbar);
polishing time: 60 seconds.

The material removal rates MRRs were determined by measuring the thickness of the HDP silicon dioxide, silicon nitride and polysilicon films on the semiconductor substrates before and after CMP using a Thermawave Optiprobe 2600.

The MRRs and the calculated oxide-to-polysilicon, nitride-to-polysilicon and oxide-to-nitride selectivities are compiled in the Table 3.

TABLE 3

The MRRs of HDP Silicon Dioxide (HDP), Silicon Nitride (SiN) and Polysilicon (PSi) and the Oxide-To-Polysilicon and Nitride-To-Polysilicon Selectivities of the Examples 1 to 9 and of the Comparative Experiment C1

| | MRR/Å/min | | | Selectivity | |
| | | | | Oxide-to-Poly-silicon | Nitride-to-Poly-silicon |
| | HDP | SiN | PSi | | |
| Example No. | | | | | |
| 1 | 1801 | 332 | 94 | 19 | 5 |
| 2 | 1782 | 404 | 26 | 79 | 5 |
| 3 | 1749 | 459 | 16 | 140 | 4 |
| 4 | 1710 | 466 | 14 | 123 | 4 |
| 5 | 1724 | 462 | 9 | 192 | 4 |
| 6 | 1788 | 450 | 43 | 42 | 4 |
| 7 | 1737 | 451 | 31 | 58 | 4 |
| 8 | 1382 | 323 | 54 | 24 | 5 |
| 9 | 1615 | 364 | 41 | 40 | 4 |
| Comparative Experiment No. | | | | | |
| C1 | 2117 | 425 | 486 | 4 | 5 |

The results of the Table 3 make apparent that the amphiphilic nonionic surfactants (B) in the aqueous polishing compositions 1 to 9 of the example 1 acted as excellent polysilicon suppressors and, in addition, did not negatively affect the nitride-to-polysilicon selectivity.

We claim:
1. An aqueous polishing composition, comprising:
an abrasive particle comprising ceria; and
an amphiphilic non-ionic surfactant,
wherein the amphiphilic non-ionic surfactant is selected from the group consisting of a water-soluble linear polyoxyalkylene block polymer, a water-soluble branched polyoxyalkylene block copolymer, a water-dispersible linear polyoxyalklene block polymer, and a water-dispersible branched polyoxyalkylene block copolymer of formula (I):

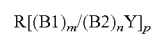

(I), wherein m is an integer ≥1;
n is an integer ≥1;
p is an integer ≥1;
R is hydrogen or a monovalent or polyvalent organic residue, other than a linear or branched alkyl group having 5 to 20 carbon atoms;
(B1) is a block consisting essentially of at least one oxyethylene monomer unit;
(B2) is a block consisting essentially of at least one substituted oxyalkylene monomer unit; and
Y is hydrogen or a monovalent organic residue, other than a linear or branched alkyl group having 5 to 20 carbon atoms, and
wherein a substituent of the at least one substituted oxyalkylene monomer unit is selected from the group consisting of at least two methyl groups, an alkyl group having at least two carbon atoms, a cycloalkyl, aryl, alkyl-cycloalkyl, alkyl-aryl, cycloalkyl-aryl, and alkyl-cycloalkyl-aryl group and
with the proviso that when the amphiphilic non-ionic surfactant comprises more than one block (B1) or (B2) then two blocks of (B1), if present, are separated from each other by a block of (B2) and two blocks of (B2), if present, are separated from each other by a block of (B1).

2. The aqueous polishing composition according to claim 1, wherein the at least one substituted oxyalkylene monomer unit of the block (B2) is derived from at least one substituted oxirane wherein a substituent of the at least one substituted oxirane monomer unit selected from the group consisting of at least two methyl groups, an alkyl group having at least two carbon atoms, a cycloalkyl, aryl, alkyl-cycloalkyl, alkyl-aryl, cycloalkyl-aryl, and alkyl-cycloalkyl-aryl group.

3. The aqueous polishing composition according to claim 2, wherein the substituent of the at least one substituted oxirane is selected from the group consisting of at least two methyl groups, an alkyl group having 2 to 10 carbon atoms, a cycloalkyl group having 5 to 10 carbon atoms in spirocyclic configuration, exocyclic configuration, annealed configuration, and a combination thereof, an aryl group having 6 to 10 carbon atoms, an alkyl-cycloalkyl group having 6 to 20 carbon atoms, an alkyl-aryl group having 7 to 20 carbon atoms, a cycloalkyl-aryl group 11 to 20 carbon atoms, and an alkyl-cycloalkyl-aryl group having 12 to 30 carbon atoms.

4. The aqueous polishing composition according to claim 3, wherein the at least one substituted oxirane is selected from the group consisting of 2-ethyl, 2,3-dimethyl, and 2,2-dimethyl oxirane.

5. The aqueous polishing composition according to claim 1, wherein the amphiphilic non-ionic surfactant has an HLB value of from 3 to 20.

6. The aqueous polishing composition according to claim 1, wherein average degrees of polymerization of the block (B1) and the block (B2) are independently from 5 to 100.

7. The aqueous polishing composition according to claim 1, wherein a weight average molecular weight of the amphiphilic non-ionic surfactant is from 1000 to 10,000 Dalton.

8. The aqueous polishing composition according to claim 1, comprising the amphiphilic non-ionic surfactant in an amount of from 0.001 to 5% by weight based on a complete weight of the aqueous polishing composition.

9. The aqueous polishing composition according to claim 1, comprising the abrasive particle in an amount of from 0.005 to 10% based on a complete weight of the aqueous polishing composition.

10. The aqueous polishing composition according to claim 1, further comprising:
a functional component, wherein the functional component is different from the abrasive particle or the amphiphilic non-ionic surfactant, and
wherein the functional component is selected from the group consisting of an organic abrasive particle, an inorganic abrasive particle, and a hybrid organic-inorganic abrasive particle different from the abrasive particle, a material having a lower critical solution temperature LCST or an upper critical solution temperature UCST, an oxidizing agent, a passivating agent, a charge reversal agent, an organic polyol having at least 2 hydroxy groups that are not dissociable in an aqueous medium, an oligomer, and a polymer formed from at least one monomer having at least 2 hydroxy groups that are not dissociable in the aqueous medium, a complexing or chelating agent, a fictive agent, a stabilizing agent, a rheology agent, a surfactant, a metal cation, an anti-microbial agent, and an organic solvent.

11. The aqueous polishing composition according to claim 10, wherein the functional component is a charge reversal agent.

12. The aqueous polishing composition according to claim 10, wherein the functional component is a charge reversal agent selected from the group consisting of a monomeric compound, an oligomeric compound, and a polymeric compound comprising at least one anionic group selected from the group consisting of a carboxylate group, a sulfinate group, a sulfate group, a phosphonate group, and a phosphate group.

13. The aqueous polishing composition according to claim 10, wherein the functional component is a charge reversal agent comprising a water-soluble condensed phosphate.

14. A process for polishing a substrate comprising:
contacting the substrate at least once with the aqueous polishing composition according to claim 1; and
polishing the substrate until a desired planarity is achieved, wherein the substrate is suitable for an electrical device, a mechanical device or an optical device.

15. The process according to claim 14, wherein the substrate comprises a film comprising a silicon oxide dielectric material and a film comprising polysilicon.

16. The process according to claim 15, wherein the substrate further comprises a film comprising silicon nitride.

17. The process according to claim 14,
wherein the electrical device is an integrated circuit device, a liquid crystal panel, an organic electroluminescent panel, a printed circuit board, a micro machine, a DNA chip, a micro plant, or a magnetic head;
the mechanical device is a high precision mechanical device; and
the optical device is an optical glass, a lens and a prism, an inorganic electro-conductive film, an optical integrated circuit, an optical switching element, an optical waveguide, an optical monocrystal, a solid laser monocrystal, a sapphire substrate for a blue laser LED, a semiconductor monocrystal, or a glass substrate for a magnetic disk.

* * * * *